US012713633B2

(12) United States Patent
Tojo et al.

(10) Patent No.: US 12,713,633 B2
(45) Date of Patent: Aug. 18, 2026

(54) SEMICONDUCTOR CIRCUIT

(71) Applicant: OTOWA ELECTRIC CO., LTD., Osaka (JP)

(72) Inventors: Takatoshi Tojo, Hyogo (JP); Minoru Tsukazaki, Hyogo (JP); Naoyuki Tsukamoto, Hyogo (JP); Shizuo Fujita, Hyogo (JP)

(73) Assignee: OTOWA ELECTRIC CO., LTD., Osaka (JP)

( * ) Notice: Subject to any disclaimer, the term of this patent is extended or adjusted under 35 U.S.C. 154(b) by 394 days.

(21) Appl. No.: 18/557,092

(22) PCT Filed: Mar. 10, 2022

(86) PCT No.: PCT/JP2022/010708
§ 371 (c)(1),
(2) Date: Oct. 25, 2023

(87) PCT Pub. No.: WO2022/239444
PCT Pub. Date: Nov. 17, 2022

(65) Prior Publication Data

US 2024/0222528 A1 Jul. 4, 2024

(30) Foreign Application Priority Data

May 11, 2021 (JP) ................................ 2021-080619

(51) Int. Cl.
*H10D 8/60* (2025.01)

(52) U.S. Cl.
CPC .................................... *H10D 8/60* (2025.01)

(58) Field of Classification Search
None
See application file for complete search history.

(56) References Cited

U.S. PATENT DOCUMENTS

| | | | |
|---|---|---|---|
| 2008/0105901 | A1 | 5/2008 | Tabatabaie et al. |
| 2013/0168837 | A1 | 7/2013 | Kato et al. |
| 2017/0194451 | A1 | 7/2017 | Hua et al. |

FOREIGN PATENT DOCUMENTS

| | | | |
|---|---|---|---|
| JP | H9-266415 | A | 10/1997 |
| JP | 2002-43522 | A | 2/2002 |
| JP | 2002-344344 | A | 11/2002 |
| JP | 2015-213140 | A | 11/2015 |
| JP | 2016-9774 | A | 1/2016 |
| JP | 2017-183400 | A | 10/2017 |

(Continued)

OTHER PUBLICATIONS

International Search Report dated Jun. 7, 2022, Application No. PCT/JP2022/010708; 4 pages.

(Continued)

*Primary Examiner* — Anthony Ho
(74) *Attorney, Agent, or Firm* — Rankin, Hill & Clark LLP

(57) ABSTRACT

Provided is a semiconductor circuit capable of protecting a semiconductor device that operates at a low voltage from a harmful pulse. A semiconductor circuit included in the semiconductor device has a semiconductor element 1 including: a first n-type semiconductor layer; a metal layer; and a Schottky barrier between the first n-type semiconductor layer and the metal layer, wherein the semiconductor element 1 is in forward connection between a signal line of the semiconductor device and a ground.

5 Claims, 2 Drawing Sheets

(56) References Cited

FOREIGN PATENT DOCUMENTS

| | | | |
|---|---|---|---|
| JP | 2019-36647 | A | 3/2019 |
| WO | 2012/023394 | A1 | 2/2012 |

OTHER PUBLICATIONS

Taiwanese Office Action dated Apr. 7, 2025 issued in corresponding Taiwanese application No. 111110300; English machine translation included (10 pages).

Japanese Office Action dated Apr. 1, 2025 issued in corresponding Japanese application No. 2021-080619; English translation included (5 pages).

10
LINE
1
GND

2eV
Pt
5eV
$Ga_2O_3$

3eV
Pt
5eV
$Ga_2O_3$
$(Al,Ga)_2O_3$

SEMICONDUCTOR CIRCUIT

TECHNICAL FIELD

The present invention relates to a semiconductor circuit that protects semiconductor microelectronics from surges due to electrostatic discharge, lightning strikes, and the like, electromagnetic pulses, intentional electromagnetic waves, and the like.

BACKGROUND ART

Conventionally, many semiconductor microelectronics comprising semiconductor circuits have been used. When a voltage more than an operating voltage is applied to the semiconductor microelectronics, a failure may be caused. Causal overvoltage sources are assumed to be surges due to static electricity, lightning strikes, and the like, electromagnetic pulses, intentional electromagnetic waves, and the like. The semiconductor microelectronics have been conventionally oriented to their improvement in integration and processing speed, and there has been no sign of finer circuit designs in their chips reaching an end. Together with this, in order to reduce power consumption, the operating voltage is being significantly reduced, and lower ones are largely below 2 V, some of those being about 1.2 V for the operation. The above also applies to durability of such low voltage semiconductor microelectronics against the overvoltage, and vulnerability of them is further being promoted due to reduction in their operating voltage.

Measures have been conventionally taken to bypass surge current to prevent failure by mounting, as an element for reducing a surge including static electricity, a ceramic element such as a varistor having zinc oxide (ZnO) as its main component, a junction element such as a TVS diode, or the like on the substrate. Since these elements, nevertheless, generally have high breakdown voltage characteristics, which is tens of volts to hundreds of volts, this has caused a problem that they are not necessarily suitable for protecting the semiconductor microelectronics which operate at low voltage as above from a harmful pulse.

Even if the forward behavior of a p-n diode and a Schottky diode of a conventional semiconductor represented by Si is to be applied to the function of the varistor or the like, forward rising voltages $V_f$ thereof are about 0.6 V to 0.7 V and about 0.2 V to 0.3 V, respectively, which are lower than the operating voltage of the semiconductor microelectronics. Accordingly, since they result in being in the ON state at all times within the region of the operating voltage of the semiconductor microelectronics, they cannot be elements that bypass the harmful pulse. Moreover, although there would be a method of using, as the protecting element, capacitors which are integrated on the substrate, for high operating frequency microelectronics, crucial signals of these result in being shunted and attenuated, which has caused a problem of disturbing normal operation of the circuit.

CITATION LIST

Patent Literature

Patent Literature 1: Japanese Patent Laid-Open No. 2019-036647

SUMMARY OF INVENTION

Technical Problem

Although Patent Literature 1 discloses a method of providing Si diodes in series and multistage in order to obtain a desired operating voltage, when a protecting circuit is provided on the chip, there is a possibility that, depending on a harmful pulse applied, it possibly acts on bonding wires upstream of the chip to cause burnout of these. Not being provided on the chip, the protecting circuit accordingly needs to take a configuration of bypassing, upstream of the bonding wires, the harmful pulse. Moreover, such series multistage also has a disadvantage of cost increasing. As above, there currently is no semiconductor circuit that can protect semiconductor microelectronics, that is, a semiconductor device, that operate at low voltage from the harmful pulse. There accordingly is required a semiconductor circuit capable of protecting a semiconductor device that operates at low voltage from the harmful pulse.

The present invention is devised in order to solve the aforementioned problem(s), and an object thereof is to provide a semiconductor circuit capable of protecting a semiconductor device that operates at low voltage from a harmful pulse.

Solution to Problem

There is provided a semiconductor circuit of the present invention comprised in a semiconductor device, the semiconductor circuit having a semiconductor element including: a first n-type semiconductor layer; a metal layer; and a Schottky barrier between the first n-type semiconductor layer and the metal layer, wherein the semiconductor circuit is in forward connection between a signal line of the semiconductor device and the ground.

The semiconductor circuit of the present invention can protect the semiconductor device that operates at low voltage from a harmful pulse. Since this semiconductor circuit is provided as a semiconductor circuit, not as a configuration on the chip, it can bypass, upstream of bonding wires, the harmful pulse, and hence, burnout of the bonding wires can be prevented.

Moreover, the first n-type semiconductor layer of the semiconductor element included in the semiconductor circuit of the present invention is preferably formed of an oxide or a nitride containing at least one selected from the group consisting of Ga, In, Sn, Mg, Zn, Al, and B, or a compound thereof.

According to the semiconductor circuit of the present invention, since the first n-type semiconductor layer of the semiconductor element included in the semiconductor circuit contains a semiconductor larger in bandgap, for example, than Si or the like, there can be readily employed the semiconductor element that has the forward rising voltage of the semiconductor element that is larger than the operating voltage of the semiconductor device.

Moreover, the metal layer of the semiconductor element included in the semiconductor circuit of the present invention is preferably formed of one or more elements selected from the group consisting of Ti, Ni, Pt, W, Mo, Au, Ta, Cu, Fe, Ag, and Cr, or an alloy thereof.

According to the semiconductor circuit of the present invention, by the metal layer, of the semiconductor element included in the semiconductor circuit, being formed of the selected metal, the forward rising voltage can be adjusted with the metal. Accordingly, the forward rising voltage can be readily set to a desired value.

Moreover, the semiconductor element included in the semiconductor circuit of the present invention preferably comprises, between the first n-type semiconductor layer and the metal layer, a second n-type semiconductor layer that is different in composition from the first n-type semiconductor layer and is larger in bandgap than the first n-type semiconductor layer.

According to the semiconductor circuit of the present invention, since the semiconductor element included in the semiconductor circuit has the second n-type semiconductor layer in addition to the first n-type semiconductor layer, the forward rising voltage of the semiconductor element included in the semiconductor circuit can be readily made high.

Moreover, at least one of the first n-type semiconductor and the second n-type semiconductor of the semiconductor element included in the semiconductor circuit of the present invention preferably contains one or more doping elements selected from the group consisting of Al, Si, Mg, Zn, In, Ga, Ge, and Sn.

According to the semiconductor circuit of the present invention, since the at least one of the first n-type semiconductor and the second n-type semiconductor of the semiconductor element included in the semiconductor circuit contains the doping element(s), the doping element(s) can readily contribute to adjusting the forward rising voltage of the semiconductor element to a desired value and making the forward rising voltage higher.

Moreover, the forward rising voltage of the semiconductor element included in the semiconductor circuit of the present invention is preferably a voltage higher than the operating voltage of the semiconductor device.

According to the semiconductor circuit of the present invention, the semiconductor device that operates at low voltage can be more securely protected from the harmful pulse.

DESCRIPTION OF EMBODIMENTS

Embodiment 1

Figures 1, 2, 3:
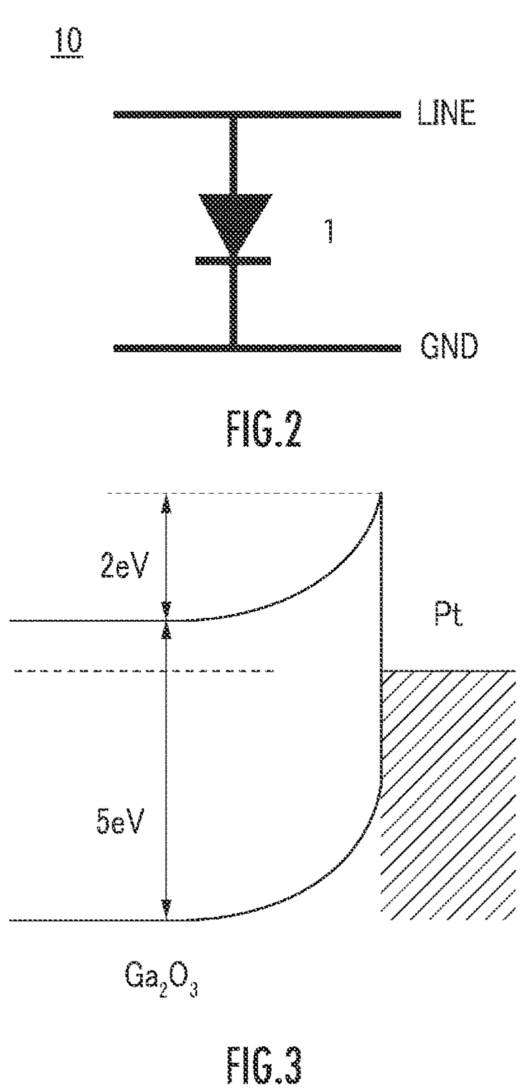
FIG. 1 is a semiconductor circuit according to Embodiment 1 of the present invention.
FIG. 2 is an energy band chart of an example of a semiconductor element in FIG. 1.
FIG. 3 is an energy band chart of an example of a semiconductor element included in a semiconductor circuit according to Embodiment 2.
Figure 4:
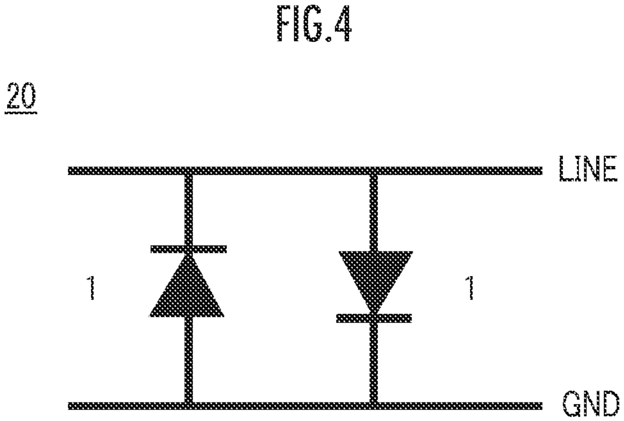
FIG. 4 is a semiconductor circuit according to Embodiment 3 of the present invention.

Hereafter, a semiconductor circuit 10 of Embodiment 1 according to the present invention is described with reference to the accompanying drawings. FIG. 1 shows the semiconductor circuit 10 according to the present invention, which includes a semiconductor element 1.

The semiconductor element 1 according to Embodiment 1 has a first n-type semiconductor layer, a metal layer, and a Schottky barrier between the first n-type semiconductor layer and the metal layer. An example of the semiconductor element 1 according to Embodiment 1 is a Schottky barrier diode. When a voltage exceeding a forward rising voltage $V_f$, such as a harmful pulse, is applied to the semiconductor element 1, a forward bias current flows in the semiconductor element 1, which leads to earthing, and a semiconductor device comprising the semiconductor element 1 is protected from the harmful pulse. The forward rising voltage $V_f$ of the semiconductor element 1 is set to a value larger than an operating voltage $V_a$ of the semiconductor device comprising the semiconductor circuit 10 including the semiconductor element 1. Accordingly, the semiconductor element 1 does not bypass signals that are not more than the forward rising voltage $V_f$, and when a harmful pulse voltage that is larger than the forward rising voltage $V_f$ is applied, the forward bias current flows in the semiconductor element 1, and the harmful pulse is earthed. That is, the semiconductor element 1 is configured so as to exhibit the behavior of a nonlinear resistor that conducts a flow in the case of the harmful pulse voltage being applied.

The first n-type semiconductor layer is formed of an oxide or a nitride containing one or more elements selected from the group consisting of Ga, In, Sn, Mg, Zn, Al, and B, or a compound thereof. An example of these is $Ga_2O_3$. The n-type semiconductor layer of the semiconductor element 1 according to the present embodiment is preferably formed of a wide bandgap semiconductor in order to increase the forward rising voltage $V_f$. Otherwise, the n-type semiconductor layer may be formed of any element other than the above as long as a desired forward rising voltage $V_f$ for the semiconductor element 1 can be obtained.

The metal layer is formed of one or more elements selected from the group consisting of Ti, Ni, Pt, W, Mo, Au, Ta, Cu, Fe, Ag, and Cr, or an alloy thereof. The Schottky barrier is formed at the junction surface between the metal layer and the first n-type semiconductor layer.

Moreover, the first n-type semiconductor layer may contain a doping material as needed. The first n-type semiconductor layer can contain, as the doping material, at least one of Al, Si, Mg, Zn, In, Ga, Ge, and Sn. By an appropriate doping element being contained in the first n-type semiconductor layer, the bandgap can be adjusted. That is, by the first n-type semiconductor layer containing the doping element, together with a combination of the element of the n-type semiconductor contained in the first n-type semiconductor layer and the element contained in the combined metal layer, the desired forward rising voltage $V_f$ can be readily obtained.

The forward rising voltage $V_f$ at which the forward bias current starts to flow in the semiconductor element 1 is set to a desired value in a range not more than about 2.5 V based on the element of the n-type semiconductor contained in the first n-type semiconductor layer and the element contained in the combined metal layer. As shown in FIG. 1, in a desired semiconductor device, the semiconductor element 1 is connected forward between a signal line (LINE) and a ground (GND) to constitute the semiconductor circuit 10. Accordingly, the semiconductor circuit 10 comprising the semiconductor element 1 can protect a semiconductor device having an operating voltage in a range less than about 2.5 V from a harmful pulse.

Next, a manufacturing method of the semiconductor element 1 included in the semiconductor circuit 10 is described. First, the first n-type semiconductor layer is formed on a substrate by a known technique. The substrate is formed, for example, of Si. The semiconductor may take any mode of a single crystal form, a polycrystalline form, an amorphous form, and the like, and may be formed into a thin film or the like. Examples of a technique for forming the thin film include mist CVD, sputtering, MO-CVD, and the like. In particular, the mist CVD is preferable since it can readily form a semiconductor layer with a uniform thickness, and in order to set the forward rising voltage $V_f$ to the desired value, can contribute to fine adjustment, for example, in units of 0.2 V to 0.3 V. After the first n-type semiconductor layer is formed, the metal layer is formed on the first n-type semiconductor layer. The metal layer is formed by a known technique, and a film deposition technique such, for example, as a vapor deposition method and a sputtering method is used.

FIG. 2 is an energy band chart of the semiconductor element 1. FIG. 2 shows, as an example, the energy band chart of the semiconductor element 1 that contains $Ga_2O_3$ in the first n-type semiconductor layer and Pt in the metal layer. In FIG. 2, the lower broken line shown on the $Ga_2O_3$ side denotes a Fermi level of the $Ga_2O_3$ semiconductor layer, and the upper broken line denotes a conduction band level. In FIG. 2, the Fermi levels of the $Ga_2O_3$ semiconductor layer and the Pt metal layer are aligned. Since a semiconductor has a forbidden band which is an energy band in which an electron orbital does not exist at the center of a carrier distribution, free electrons in the conduction band of the n-type semiconductor are placed at a higher energy level than the energy level at which free electrons in a metal exist, and a valence band is placed at a lower energy level. When the n-type semiconductor layer and the metal layer are joined, free electrons in the n-type semiconductor layer move to the metal layer and decrease. Although the position of the Fermi level accordingly changes due to the resulting change in carrier distribution of the n-type semiconductor at the junction portion, since the Fermi level itself does not move unless a potential is externally given, the energy levels of the conduction band and the valence band of the n-type semiconductor at the junction portion relatively change with respect to the position of the Fermi level. The Schottky barrier is formed between the n-type semiconductor layer and the metal layer as above. In the present invention, the forward rising voltage is increased by selecting the elements contained in the n-type semiconductor layer and the metal layer, respectively, used for the semiconductor element 1 such that the Schottky barrier is as large as possible. Moreover, causing the n-type semiconductor layer to contain a metal as the doping material can contribute to readily obtaining a large forward rising voltage. In the present embodiment, the bandgap of $Ga_2O_3$ is 5 eV, and the Schottky barrier between $Ga_2O_3$ and Pt is 2 eV. Meanwhile, as to a capacitance of the semiconductor element 1, when the diameter of the Pt electrode is $30 mm, the specific dielectric constant of $Ga_2O_3$ is 10, and the carrier density is $10^{17}$ $cm^{-3}$, the capacitance has a low value, 0.42 pF.

Operation of the semiconductor circuit 10 comprising the semiconductor element 1 configured as above is described. As to the semiconductor element, the semiconductor element that has the forward rising voltage $V_f$ slightly higher than the operating voltage $V_a$ of the semiconductor device is incorporated in the semiconductor circuit 10. For example, when the operating voltage $V_a$ of the semiconductor device is 1.2 V, the semiconductor element 1 having the forward rising voltage $V_f$ of about 1.2 V to 2.0 V which is slightly higher than 1.2 V is used. When a voltage higher than 1.2 V, such as a harmful pulse, is applied to the semiconductor device, the forward bias current flows in the semiconductor element 1, which leads to bypassing, and the harmful pulse is earthed. Accordingly, a surge current can be prevented from flowing in the semiconductor device, and an IC or the like comprised in the semiconductor device can be prevented from being damaged due to the harmful pulse.

The semiconductor element 1 included in the semiconductor circuit 10 according to the present invention is a Schottky diode. Therefore, the semiconductor circuit 10 according to the present invention has an advantage of having a higher response speed than an p-n junction diode which is an element in which both of a large number of carriers and a small number of carriers participate. Accordingly, a signal of the semiconductor device is not shunted to be attenuated. Moreover, since the semiconductor element 1 can be formed by a thin film technique, the semiconductor circuit 10 can be made thin and small, and accordingly, can be readily formed on a substrate. Moreover, since it is a thin and single component, there is no disadvantage in securing a space for its placement upstream of bonding wires. Moreover, its low capacitance leads to an advantage in responsiveness.

Accordingly, according to Embodiment 1 of the present invention, there can be provided a semiconductor circuit capable of bypassing, even when a harmful pulse is applied to a semiconductor device the operating voltage of which is a low voltage, the harmful pulse to prevent the semiconductor device from being damaged.

Embodiment 2

Hereafter, a semiconductor circuit of Embodiment 2 according to the present invention is described. The semiconductor circuit according to Embodiment 2 is the same as that of Embodiment 1, and its description and illustration are omitted. A semiconductor element included in the semiconductor circuit of Embodiment 2 is different from that of Embodiment 1 only in comprising, between the first n-type semiconductor layer and the metal layer, a second n-type semiconductor layer that is different in composition from the first n-type semiconductor layer and is larger in bandgap than the first n-type semiconductor layer.

The second n-type semiconductor layer has a different composition from that of the first n-type semiconductor layer and is formed of an oxide or a nitride containing one or more elements selected from the group consisting of Ga, In, Sn, Mg, Zn, Al, and B, or a compound thereof. An example of these is $(Al, Ga)_2O_3$ or the like. The n-type semiconductor layer of the semiconductor element according to this Embodiment 2 is preferably formed of a wide bandgap semiconductor in order to increase the forward rising voltage $V_f$. Otherwise, the n-type semiconductor layer may be formed of any element other than the above as long as a desired forward rising voltage $V_f$ for the semiconductor element can be obtained.

The semiconductor element according to Embodiment 2 is a Schottky barrier diode, for example, having two n-type semiconductor layers. When a voltage exceeding the forward rising voltage $V_f$, such as a harmful pulse, is applied to the semiconductor element, the forward bias current flows in the semiconductor element, which leads to earthing, and a semiconductor device comprising the semiconductor element is protected from the harmful pulse. In the present embodiment, by the second n-type semiconductor layer being comprised in addition to the first n-type semiconductor layer, the bandgap can be increased. Thereby, the forward rising voltage $V_f$ of the semiconductor element can be made high.

Optimum doping materials can be contained in the first n-type semiconductor layer and the second n-type semiconductor layer, respectively, as needed. Each of the first n-type semiconductor layer and the second n-type semiconductor layer can contain, as the doping material, at least one of Al, Si, Mg, Zn, In, Ga, Ge, and Sn, the at least one being optimum for each. By appropriate doping elements being contained in the first n-type semiconductor layer and the second n-type semiconductor layer, the bandgap can be adjusted. That is, by the first n-type semiconductor layer and the second n-type semiconductor layer containing the doping elements, together with a combination of the element of the n-type semiconductor contained in the first n-type semiconductor layer and the second n-type semiconductor layer and the element of the metal layer, the desired forward rising voltage $V_f$ can be readily obtained.

The forward rising voltage $V_f$ at which the forward bias current starts to flow in the semiconductor element 1 is set to a desired value in a range larger than about 2 V based on the element of the n-type semiconductor contained in the first n-type semiconductor layer, the element of the n-type semiconductor contained in the second n-type semiconductor layer, and the element contained in the combined metal layer. The semiconductor circuit comprising the semiconductor element of the present embodiment can protect a semiconductor device having the operating voltage $V_a$ of about 2 V or higher from a harmful pulse.

FIG. 3 is an energy band chart of the semiconductor element according to Embodiment 2. FIG. 3 shows, as an example, the energy band chart of the semiconductor element that contains $Ga_2O_3$ in the first n-type semiconductor layer, $(Al,Ga)_2O_3$ in the second n-type semiconductor layer, and Pt in the metal layer. In FIG. 3, the lower broken line shown on the n-type semiconductor side denotes a Fermi level of the semiconductor layers of $Ga_2O_3$ and $(Al,Ga)_2O_3$, and the upper broken line denotes a conduction band level. In FIG. 3, the Fermi levels of the $Ga_2O_3$ semiconductor layer and the Pt metal layer are aligned. In FIG. 2, the Fermi levels of the n-type semiconductor layer and the Pt metal layer are aligned. Since a semiconductor has a forbidden band which is an energy band in which an electron orbital does not exist at the center of a carrier distribution, free electrons in the conduction band of the n-type semiconductor are placed at a higher energy level than the energy level at which free electrons in a metal exist, and a valence band is placed at a lower energy level. When the n-type semiconductor layer and the metal layer are joined, free electrons in the n-type semiconductor layer move to the metal layer and decrease. Although the position of the Fermi level accordingly changes due to the resulting change in carrier distribution of the n-type semiconductor at the junction portion, since the Fermi level itself does not move unless a potential is externally given, the energy levels of the conduction band and the valence band of the n-type semiconductor at the junction portion relatively change with respect to the position of the Fermi level. The Schottky barrier is formed between the n-type semiconductor layer and the metal layer as above. The semiconductor element of Embodiment 2 comprises the second n-type semiconductor layer between the first n-type semiconductor layer and the metal layer. Therefore, it has a higher conduction band level of the semiconductor layer than the semiconductor element 1 of Embodiment 1. Moreover, as with Embodiment 1, causing the n-type semiconductor layer to contain a metal as the doping material can contribute to readily obtaining a large forward rising voltage. In the present embodiment, it can be considered that by inserting $(Al,Ga)_2O_3$ larger in bandgap than $Ga_2O$; between $Ga_2O_3$ and Pt, there arise energy differences of 3 eV in the conduction band and 0.2 eV in the valence band and there can be obtained a larger barrier height than in Embodiment 1. As above, by the second n-type semiconductor layer being included in addition to the first n-type semiconductor layer, the barrier height can be increased. This configuration can set the forward rising voltage $V_f$ to a value larger by 1 V than in the case of $Ga_2O_3$ only. Meanwhile, as to a capacitance of this semiconductor element, when the diameter of the Pt electrode is ϕ30 mm, the specific dielectric constant of $Ga_2O_3$ is 10, and the carrier density is $10^{17}$ $cm^{-3}$, the capacitance has a low value, 0.38 pF.

Operation of the semiconductor circuit comprising the semiconductor element configured as above is described. As to the semiconductor element, the semiconductor element that has the forward rising voltage $V_f$ set to be slightly higher than the operating voltage $V_a$ of the semiconductor device is incorporated in the semiconductor circuit. For example, when the operating voltage $V_a$ of the semiconductor device is 3 V, the semiconductor element having the forward rising voltage $V_f$ of about 3.2 V to 4 V which is slightly higher than 3 V is used. When a voltage higher than 3 V, such as a harmful pulse, is applied to the semiconductor device, the forward bias current flows in the semiconductor element, which leads to bypassing, and the harmful pulse is earthed.

Accordingly, according to Embodiment 2 of the present invention, there can be provided a semiconductor circuit capable of bypassing, even when a harmful pulse is applied to a semiconductor device the operating voltage of which is a low voltage and slightly higher than in Embodiment 1, the harmful pulse to prevent the semiconductor device from being damaged.

Embodiment 3

Hereafter, a semiconductor circuit of Embodiment 3 according to the present invention is described. The semiconductor element according to Embodiment 3 is the same as the semiconductor element 1 of Embodiment 1. A semiconductor circuit 20 of Embodiment 3 is different from the semiconductor circuit 10 of Embodiment 1 in that the semiconductor elements 1 are connected to a semiconductor device in parallel and have inverse characteristics to each other.

The semiconductor circuit 10 of Embodiment 1 has the semiconductor element 1 put in forward connection in the semiconductor device and bypasses a harmful pulse input from the signal line (LINE). Nevertheless, there is a possibility that a harmful pulse invades also from the ground (GND), not only from the signal line (LINE). Therefore, the semiconductor circuit 20 of Embodiment 3 is configured as the semiconductor circuit 20 that has one semiconductor element 1 in forward connection and one semiconductor element 1 in reverse connection in the semiconductor device. Accordingly, the semiconductor circuit 20 can bypass the harmful pulses invading both from the signal line (LINE) and the ground (GND). When a harmful pulse invades into the ground (GND) of the semiconductor device, the harmful pulse passes through the semiconductor element 1 that is in reverse connection to the semiconductor circuit 20 and through the signal line (LINE), and is bypassed to the ground (GND) by the semiconductor element 1 that is in forward connection to the semiconductor circuit 20.

Accordingly, according to Embodiment 3 of the present invention, there can be provided a semiconductor circuit capable of bypassing, even when a harmful pulse is applied to any of the signal line (LINE) and the ground (GND), the harmful pulse to prevent the semiconductor device from being damaged. For both of or any one of the semiconductor elements of Embodiment 3, there may be used, in place of the semiconductor element 1 of Embodiment 1, the semiconductor element of Embodiment 2, which is the semiconductor element that comprises: the first n-type semiconductor layer; the metal layer; and between the first n-type semiconductor layer and the metal layer, the second n-type semiconductor layer that is different in composition from the first n-type semiconductor layer and is larger in bandgap than the first n-type semiconductor layer. Moreover, as with Embodiments 1 and 2, the forward rising voltage of the semiconductor element 1 can be set to be an optimum value in accordance with the operating voltage of the semiconductor device including the semiconductor circuit 20, and the like.

REFERENCE SIGNS LIST

1 semiconductor element
10, 20 semiconductor circuit

The invention claimed is:

1. A semiconductor circuit comprised in a semiconductor device, the semiconductor circuit having a semiconductor element including:

a first n-type semiconductor layer;

a metal layer; and a Schottky barrier between the first n-type semiconductor layer and the metal layer, wherein the semiconductor element is in forward connection between a signal line of the semiconductor device and a ground, and the semiconductor element comprises, between the first n-type semiconductor layer and the metal layer, a second n-type semiconductor layer that is different in composition from the first n-type semiconductor layer and is larger in bandgap than the first n-type semiconductor layer.

2. The semiconductor circuit according to claim 1, wherein at least one of the first n-type semiconductor layer and the second n-type semiconductor layer contains one or more doping elements selected from a group consisting of Al, Si, Mg, Zn, In, Ga, Ge, and Sn.

3. The semiconductor circuit according to claim 1, wherein the first n-type semiconductor layer is formed of an oxide or a nitride containing at least one selected from a group consisting of Ga, In, Sn, Mg, Zn, Al, and B, or a compound thereof.

4. The semiconductor circuit according to claim 1, wherein the metal layer is formed of one or more elements selected from a group consisting of Ti, Ni, Pt, W, Mo, Au, Ta, Cu, Fe, Ag, and Cr, or an alloy thereof.

5. The semiconductor circuit according to claim 1, wherein a forward rising voltage of the semiconductor element is a voltage higher than an operating voltage of the semiconductor device.

* * * * *